US011804452B2

(12) United States Patent
Polomoff et al.

(10) Patent No.: US 11,804,452 B2
(45) Date of Patent: Oct. 31, 2023

(54) PIC STRUCTURE HAVING BARRIER SURROUNDING OPENING FOR OPTICAL ELEMENT TO PREVENT STRESS DAMAGE

(71) Applicant: GLOBALFOUNDRIES US Inc., Malta, NY (US)

(72) Inventors: Nicholas A Polomoff, Hopewell Junction, NY (US); Jae Kyu Cho, Niskayuna, NY (US); Mohamed Rabie, Clifton Park, NY (US); Yunyao Jiang, Mechanicville, NY (US); Koushik Ramachandran, Wappingers Falls, NY (US); Pallabi Das, Bangalore (IN)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 80 days.

(21) Appl. No.: 17/389,759

(22) Filed: Jul. 30, 2021

(65) Prior Publication Data

US 2023/0030723 A1    Feb. 2, 2023

(51) Int. Cl.
  *G02B 6/12*  (2006.01)
  *G02B 6/10*  (2006.01)
  *H01L 23/00* (2006.01)
  *H01L 23/58* (2006.01)
  *G02B 6/30*  (2006.01)
  (Continued)

(52) U.S. Cl.
  CPC ........ *H01L 23/562* (2013.01); *G02B 6/12004* (2013.01); *G02B 6/125* (2013.01); *G02B 6/13* (2013.01); *G02B 6/30* (2013.01); *H01L 23/585* (2013.01)

(58) Field of Classification Search
  CPC ............... H01L 23/562; H01L 23/585; H01L 25/167; G02B 6/12004; G02B 6/125; G02B 6/13; G02B 6/30; G02B 6/4245; G02B 6/4257

USPC .......................................... 385/14, 129–132
See application file for complete search history.

(56) References Cited

U.S. PATENT DOCUMENTS

| 7,098,676 B2 | 8/2006 | Landers et al. |
| 7,491,578 B1 | 2/2009 | Shaw et al. |
| 8,604,577 B2 | 12/2013 | Koch |

(Continued)

FOREIGN PATENT DOCUMENTS

| EP | 2539979 B1 | 5/2018 |
| JP | 2009170763 A | 7/2009 |

OTHER PUBLICATIONS

U.S. Appl. No. 16/830,543, filed Mar. 26, 2020, entitled "Corner Structures for an Optical Fiber Groove".

*Primary Examiner* — Kaveh C Kianni
*Assistant Examiner* — Hung Q Lam
(74) *Attorney, Agent, or Firm* — Anthony Canale; Hoffman Warnick LLC

(57) ABSTRACT

A photonic integrated circuit (PIC) structure includes an active region in at least an active layer over a substrate, the active region including a plurality of transistors therein. A plurality of dielectric interconnect layers are over the active region, and an opening is defined through the plurality of dielectric interconnect layers. The opening extends to at least the active layer. A barrier is within the plurality of dielectric interconnect layers and surrounding the opening. An optical element is positioned in the opening. The barrier prevents stress damage, such as cracks and/or delaminations, from propagating from or to the opening, and maintains the hermetic seal of the PIC structure.

20 Claims, 12 Drawing Sheets

(51) Int. Cl.
*G02B 6/125* (2006.01)
*G02B 6/13* (2006.01)

(56) References Cited

U.S. PATENT DOCUMENTS

| | | |
|---|---|---|
| 9,606,291 B2 | 3/2017 | Ellis-Monaghan et al. |
| 9,874,690 B2 * | 1/2018 | Gambino ............... G02B 6/423 |
| 10,062,748 B1 * | 8/2018 | Stamper ................ H01L 23/585 |
| 10,234,646 B2 | 3/2019 | Mack et al. |
| 2008/0230874 A1 | 9/2008 | Yamada et al. |
| 2011/0133329 A1 * | 6/2011 | Takahashi ............... H01L 23/13 |
| | | 438/122 |
| 2014/0339703 A1 | 11/2014 | Farooq et al. |
| 2016/0291265 A1 | 10/2016 | Kinghorn et al. |
| 2016/0358905 A1 * | 12/2016 | Balakrishnan ...... H01L 21/8252 |

* cited by examiner

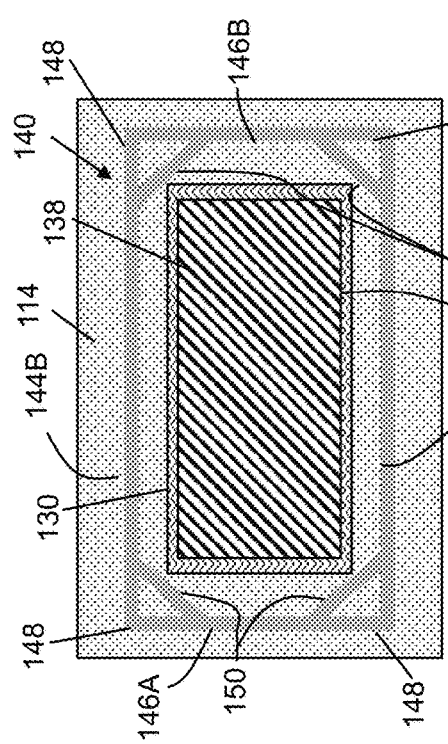
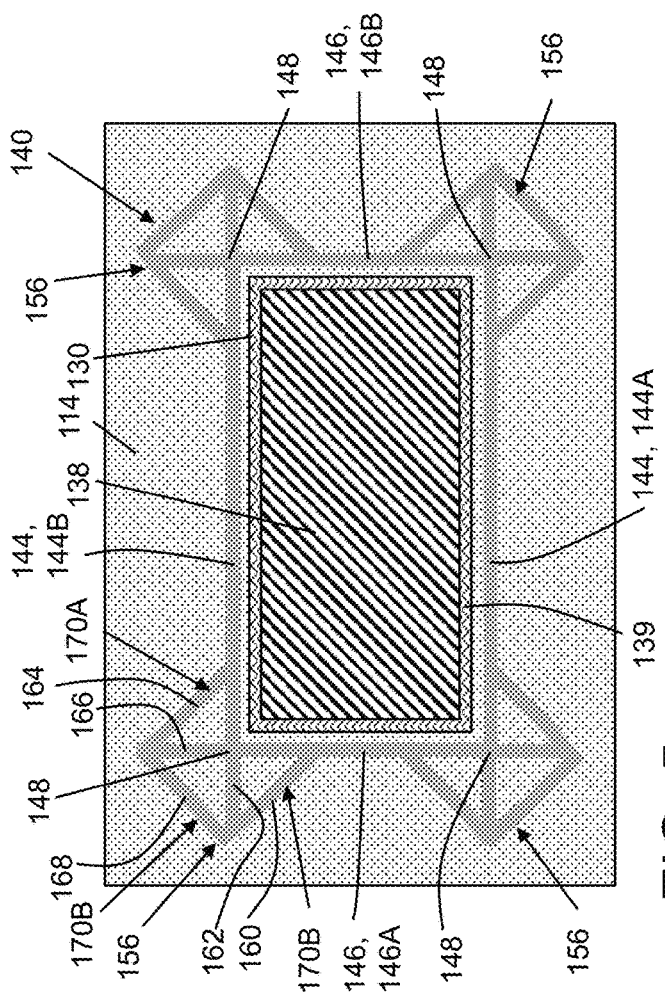

US 11,804,452 B2

PIC STRUCTURE HAVING BARRIER SURROUNDING OPENING FOR OPTICAL ELEMENT TO PREVENT STRESS DAMAGE

BACKGROUND

The present disclosure relates to photonic integrated circuits (PICs), and more specifically, to a PIC structure including a barrier within a plurality of dielectric interconnect layers. The barrier surrounds an opening for an optical element within an active region of the PIC structure. The barrier prevents stress damage from impacting the integrity of the PIC structure.

Current photonic integrated circuit (PIC) structures require complex packaging integration schemes. One challenge is providing optical coupling between the PIC structure and optical elements such as a laser. In order to attach and mount a separately manufactured optical element to a PIC structure, a deep large opening, such as a cavity or trench, may be made in, or near, the middle of a PIC die. To create this opening an area must be etched, removing all the back-end-of-line (BEOL) and middle-of-line (MOL) dielectric interconnect layers over an active layer of the PIC structure down to and into the substrate. The optical element can then be mounted in the opening and optically connected to other components in the PIC die such as waveguides, photodetectors, etc. The opening can create stresses and strain in the PIC die adjacent the active region of the PIC die. Cracks and/or delaminations can thus originate from the opening, or propagate to the opening from other parts of the PIC die. The formation of the opening also breaks the hermetic seal of the dielectric interconnect layers, possibly allowing moisture ingress to the active region.

SUMMARY

An aspect of the disclosure is directed to a photonic integrated circuit (PIC) structure, comprising: an active region in at least an active layer over a substrate; a plurality of dielectric interconnect layers over the active region; an opening defined through the plurality of dielectric interconnect layers and positioned within the active region, the opening extending to at least the active layer; and a barrier within the plurality of dielectric interconnect layers and surrounding the opening.

Another aspect of the disclosure includes a photonic integrated circuit (PIC) structure, comprising: an active region in at least an active layer over a substrate; a plurality of dielectric interconnect layers over the active region; an opening defined through the plurality of interconnect layers and positioned within the active region, the opening extending to at least the active layer; and a barrier within the plurality of dielectric interconnect layers and surrounding the opening; wherein the barrier includes a first wall portion meeting a second wall portion at a corner, and a chamfer wall portion spanning between the first wall portion and the second wall portion across the corner.

An aspect of the disclosure related to a method, comprising: forming a barrier with a plurality of dielectric interconnect layers over an active layer of an active region of a photonics integrated circuit (PIC) structure, the barrier surrounding a reserved area within the active region; and forming an opening in the reserved area and through the plurality of dielectric interconnect layers to at least the active layer of the active region, wherein the barrier includes a first wall portion meeting a second wall portion at a corner, and a chamfer wall portion spanning between the first wall portion and the second wall portion across the corner.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 4 shows a schematic plan view of a barrier in a PIC structure, according to embodiments of the disclosure.

FIG. 5 shows a schematic plan view of a barrier in a PIC structure, according to another embodiment of the disclosure.

Figure 1:
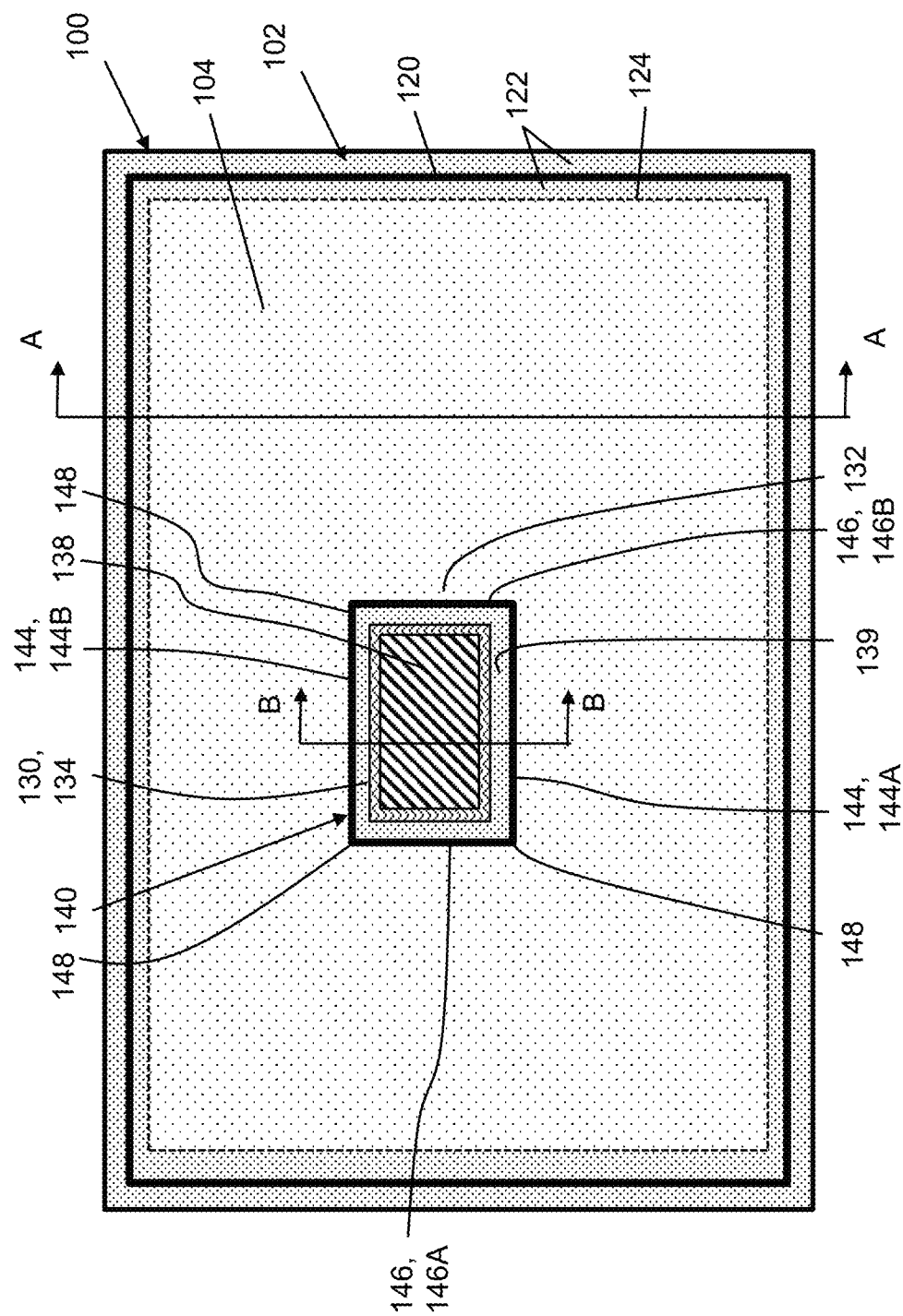
FIG. 1 shows a schematic plan view of a photonics integrated circuit (PIC) structure, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "certain embodiment," "one embodiment," or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a photonic integrated circuit (PIC) structure. The PIC structure includes an active region in at least an active layer over a substrate. The active region includes, among perhaps other components, a plurality of transistors therein. A plurality of dielectric interconnect layers, e.g., back-end-of-line (BEOL) or middle-of-line (MOL) interconnect layers, are over the active region. The PIC structure may also include a variety of optical elements such as waveguides, photodetectors, among other elements. An opening is defined through the plurality of dielectric interconnect layers and positioned within the active region, e.g., in the middle of the active region. The opening extends to at least the active layer. A barrier is within the plurality of dielectric interconnect layers and surrounds the opening. The barrier may be within an inner extent of the active region, e.g., within all components of the active region. An optical element, such as a laser, is positioned in the opening. Optical communication between the optical element and the active region can be provided in a number of ways. The barrier prevents stress damage, such as cracks and/or delaminations, from propagating from or to the opening, and hermetically seals the dielectric interconnect layers despite the opening being formed therein. The barrier also reinforces dielectric interconnect layers adjacent the opening.

Figure 2:
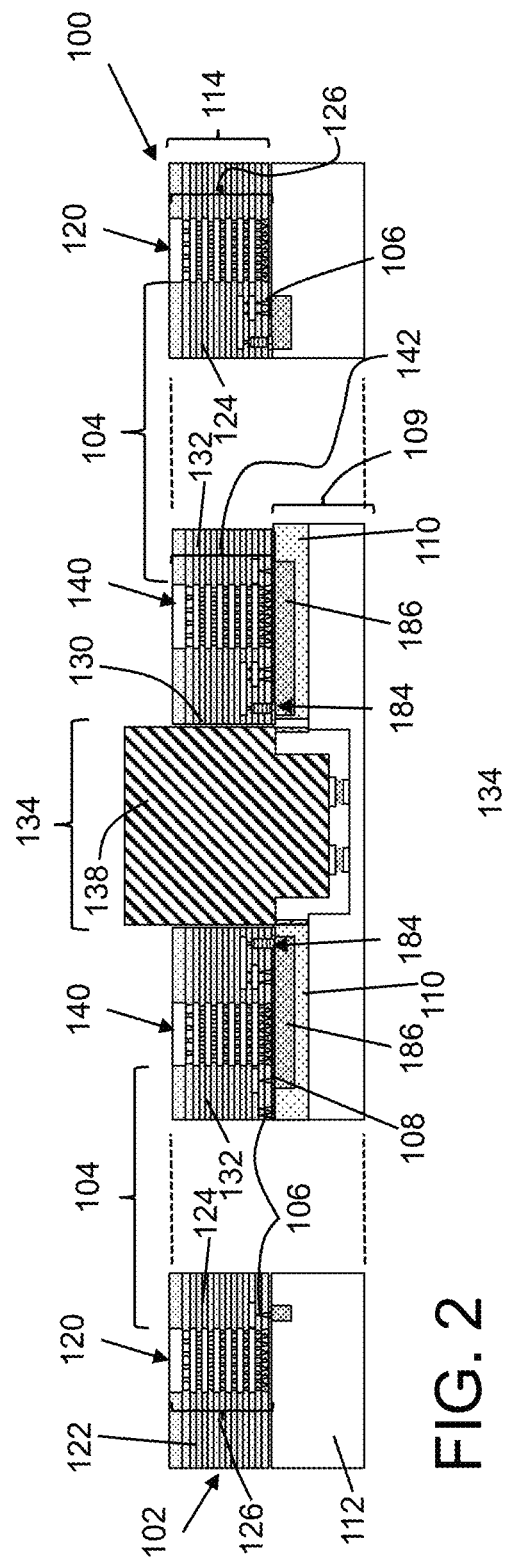
FIG. 2 shows a schematic partial cross-sectional view of the PIC structure of FIG. 1 along view line A-A.
Figure 3:
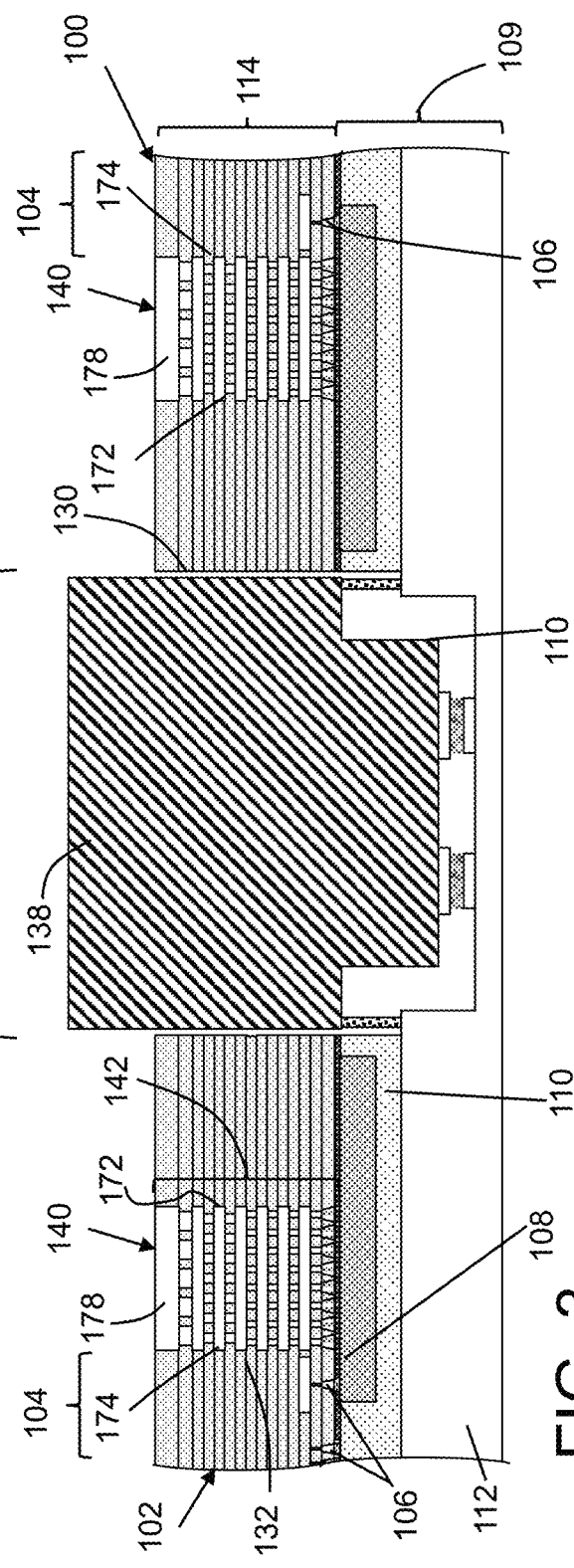
FIG. 3 shows a cross-sectional view of the PIC structure of FIG. 1 along view line B-B.

FIGS. 1-3 show various views of a PIC structure 100 according to embodiments of the disclosure. FIG. 1 shows a schematic plan view of PIC structure 100, FIG. 2 shows a schematic partial cross-sectional view along line A-A in FIG. 1, and FIG. 3 shows an enlarged cross-sectional view along line B-B in FIG. 1. PIC structure 100 can provide any now known or later developed photonics integrated circuit functions and any necessary active components to provide such functions. Referring collectively to FIGS. 1 and 2, PIC structure 100 includes a body 102 including an active region 104 therein. Active region 104 may include, among other integrated circuit components, a plurality of transistors 106 therein. Active region 104 may take any now known or later developed form. In one non-limiting example, active region 104 may include a number of transistors 106 formed in and/or on an active layer 108. However, any component typically found in an active region of a PIC structure may be employed. In one non-limiting example shown, active region 104 may be formed over a semiconductor-on-insulator (SOI) substrate 109. SOI substrate 109 may include an active (SOI) layer 108 including a semiconductor such as silicon, silicon germanium or other semiconductor materials. As known in the art, active layer 108 may be doped in certain regions to form parts of transistors 106, interconnects, or other components. In the non-limiting example shown, active layer 108 is over a buried insulator layer 110, which is over a base substrate 112. Buried insulator layer 110 may include, for example, silicon dioxide, and base substrate 112 may include a semiconductor, e.g., silicon. While active region 104 is shown using an SOI substrate 109, it will be recognized that the teachings of the disclosure are applicable to any form of IC substrate, e.g., a bulk substrate.

PIC structure 100 also includes a plurality of dielectric interconnect layers 114 over active region 104. Dielectric interconnect layers 114 may include any now known or later developed interlayer dielectric material, such as but not limited to: silicon dioxide materials, fluorinated silicate glass (FSG), organic polymeric thermoset materials, silicon oxycarbide, hydrogenated silicon oxycarbide (SiCOH) dielectrics, fluorine doped silicon oxide, spin-on glasses, silsesquioxanes, etc. Dielectric interconnect layers 114 may also include any now known or later developed electrical interconnects (not shown for clarity) within the layers, such as horizontal metal wiring and vertical vias operative to electrically interconnect, for example, parts of active region 104. The metal wiring and vias may include bodies of any now known or later developed conductive materials such a copper, aluminum, tungsten, etc., and may include refractory metal liners of, for example, tantalum (Ta), titanium (Ti), tungsten (W), iridium (Ir), rhodium (Rh) and platinum (Pt), etc., or mixtures of thereof. The electrical interconnects may be formed using any thin film technology.

Active region 104 and dielectric interconnect layers 114 may be formed using any now known or later developed thin film technology. Dielectric interconnect layers 114 may include any back-end-of-line (BEOL) or middle-of-line (MOL) interconnect layers, i.e., interconnect layers formed in the course of device manufacturing following first metallization.

Continuing with FIGS. 1 and 2, in certain embodiments, PIC structure 100 optionally includes a crack stop ring 120 (shown as line in FIG. 1) extending about an outer periphery 122 of PIC structure 100. Crack stop ring 120 is positioned outside of active region 104, e.g., in plurality of dielectric interconnect layers 114 (FIG. 2). Crack stop ring 120 may be formed during formation of dielectric interconnect layers 114 (and a barrier 140, described herein), extending along outer periphery 122 of PIC structure 100 (i.e., body 102) and positioned outside of an outer extent 124 of active region 104, i.e., outside all of the components of active region 104. Crack stop ring 120 may include any now known or later developed crack stop ring structure. For example, crack stop ring 120 may include a plurality of interconnected (metal) wire and via layers 126. The metal wire and via layers of crack stop ring 120 may include the same materials as the electrical interconnects (not shown) in dielectric interconnect layers 114, and may be formed using any thin film technology.

Referring again to FIGS. 1-3, PIC structure 100 also includes an opening 130 defined through plurality of dielectric interconnect layers 114. Opening 130 is positioned within active region 104. That is, most components of active region 104 are radially outside of opening 130. In certain embodiments, opening 130 may be positioned within an inner extent 132 of active region, meaning all components of active region 104 are radially outside of opening 130. In any event, during fabrication of active region 104 and dielectric interconnect layers 114, a reserved area 134 may be positioned within body 102 and within active region 104. Reserved area 134 is reserved for opening 130. Opening 130 is formed in reserved area 134 and through plurality of dielectric interconnect layers 114 to at least active layer 108 of active region 104. As shown in FIGS. 2 and 3, opening 130 may be formed into base substrate 112. Opening 130 may be formed in reserved area 134 using any appropriate etching process for layers 114 and/or any residual structures in reserved area 134, e.g., using a patterned mask (not shown) and a reactive ion etch (ME). Reserved area 134 may be devoid of residual IC structures such as transistors, resistors, interconnects, etc., but it may include some residual IC structures that can be removed during formation of opening 130. Although opening 130 is shown extending into base substrate 112, it will be recognized that opening 130 may extend to at least active layer 108.

PIC structure 100 may also include an optical element 138 positioned in opening 130. Opening 130 can have any bottom surface shape and any horizontal cross-sectional shape to accommodate optical element 138 to be positioned therein. Any now known or later developed support structures (not labeled) necessary to support and/or position optical element 138 in opening 130 can be provided. Optical element 138 may include any now known or later developed optics- or photonics-based structure that may be added to body 102, for example, after formation of body 102 and opening 130. Optical element 138 may be, in certain embodiments, external to the rest of the PIC, i.e., optical element 138 is not integral with layers of body 102, and is not formed simultaneously with body 102 of PIC structure 100. In one example, optical element 138 may be a separately manufactured component, such as a laser, that is added to body 102 after formation of opening 130. Optical element 138 may be coupled in opening 130 using any now known or later developed processing, e.g., ball grid array technology, and may be sealed in position using any solution, e.g., a polymer 139 (FIG. 1). In any event, the coupling ensures optical element 138 can optically communicate with the rest of PIC structure 100. More specifically, as will be described further herein, optical element 138 may optically communicate with one or more components in at least one of dielectric interconnect layers 114, buried insulator layer 110, active layer 108 and base substrate 112.

Opening 130 creates stresses and strains in body 102. It has been discovered that the corner regions of opening 130 and lower metal layers in dielectric interconnect layers 114 near the edges of opening 130 exhibit the highest stress. Stress can result from, for example, coefficient of thermal expansion (CTE) mismatch between different materials during, for example, solder reflow used to electrically interconnect parts of PIC structure 100. The formation of opening 130 also breaks the hermetic seal of dielectric interconnect layers 114, possibly allowing moisture ingress to active region 104. In order to address this issue, PIC structure 100 may also include a barrier 140 (line in FIG. 1) within plurality of dielectric interconnect layers 114 and surrounding opening 130. Barrier 140 is within active region 104, i.e., it can be inward of most if not all active region 104 and components thereof. In certain embodiments, barrier 140 may be within inner extent 132 of active region 104, meaning it is within all components of active region 104. In this case, barrier 140 may be shaped as a continuous loop within a particular cross-section (e.g., in the plan view of FIG. 1 as shown).

Barrier 140 may include any structure capable of preventing stress damage created by opening 130 in body 102. In certain embodiments, barrier 140 includes a plurality of interconnected wire and via layers 142, similar to crack stop ring 120. That is, each wall portion of barrier 140 includes plurality of interconnected wire and via layers 142. In certain embodiments, barrier 140 may include only plurality of interconnected wire and via layers 142 arranged to surround opening 130. Here, barrier 140 is similar in structure to crack stop ring 120, but is positioned within active region 104, instead of outwardly of active region 104 as are all conventional crack stop rings. Barrier 140 may have any shape within a plane of body 102 configured to surround opening 130. As shown in phantom in FIG. 1, barrier 140 includes a first wall portion 144 meeting a second wall portion 146 at a corner 148. Barrier 140 may have any polygonal shape having wall portions 142, 144. In the particular examples shown, barrier 140 is rectangular and includes a pair of first wall portions 144A, 144B and an opposing pair of second wall portions 146A, 146B. Here, pair of first wall portions 144A, 144B meet opposing pair of second wall portions 146A, 146B to form four corners 148. Again, each wall portion 144, 146 includes plurality of interconnected wire and via layers 142 (FIGS. 2-3). In this manner, barrier 140 can resist stress damage from propagating to or from opening 130 and forming cracks, delaminations and other physical damage. Barrier 140 also hermetically seals dielectric insulating layers 114 to prevent moisture from damaging the structure. Barrier 140 also provides additional structural support to dielectric interconnect layers 114.

Figure 6:
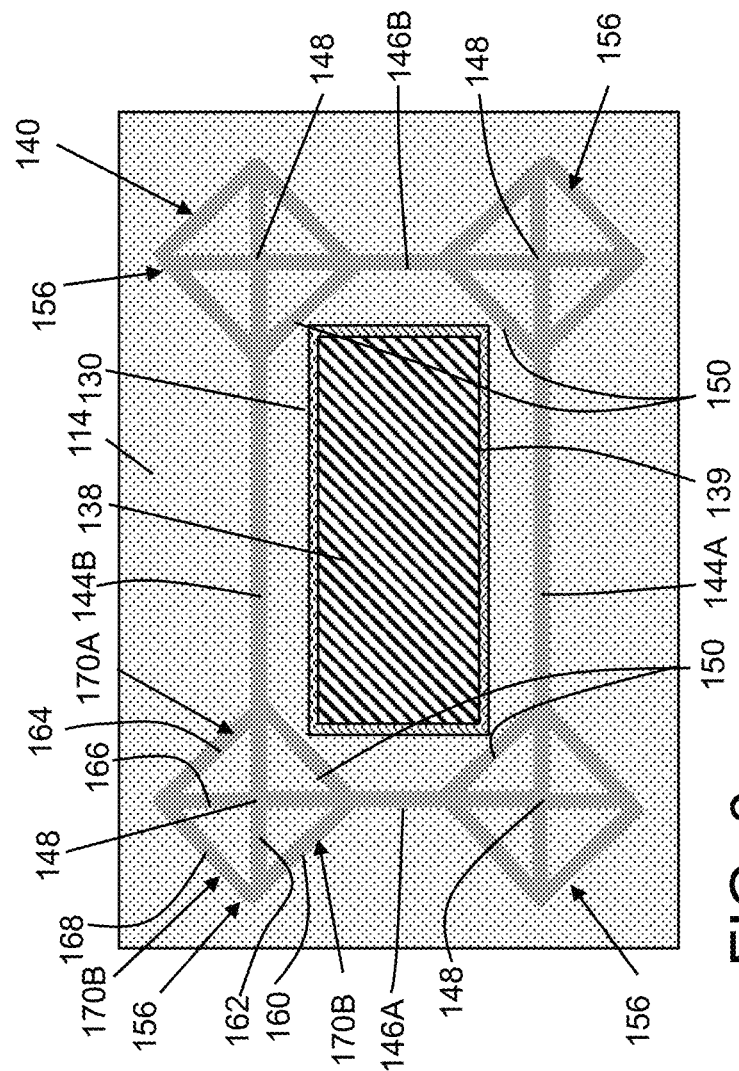
FIG. 6 shows a schematic plan view of a barrier in a PIC structure, according to other embodiments of the disclosure.

In other embodiments, barrier 140 may include the above-described wall portions 144, 146, and additional structures. The additional structures improve the barrier's performance relative to opening 130 and optical element 138. FIGS. 4-6 show schematic plan views of various embodiments of barrier 140 including these additional structures.

As shown in FIG. 4, in certain embodiments, barrier 140 includes first wall portion(s) 144 meeting second wall portion(s) 146 at corner(s) 148, and a chamfer wall portion 150 spans between first wall portion(s) 144 and second wall portion(s) 146 across corner(s) 148. While not necessary at all corners 148, a chamfer wall portion 150 may span between each first wall portion 144 and a respective second wall portion 146 across each corner 148. In the example shown, first wall portion(s) 144 meets second wall portion(s) 146 at perpendicular angles at corner(s) 148. Hence, chamfer wall portion(s) 150 span between first wall portion(s) 144 and second wall portion(s) 146 across the perpendicular angle. It will be recognized that in other embodiments, wall portions 144, 146 may not meet at perpendicular angles. FIG. 4 shows barrier 140 with optical element 138. Each wall portion 144, 146, 150 includes plurality of interconnected wire and via layers 142 (FIGS. 2-3). Chamfer wall portion(s) 150 improve the barrier's stress damage resistance and hermetic seal maintenance by providing a wall portion in locations where stress is highest, i.e., corner regions of opening 130 and lower metal layers in dielectric interconnect layers 114 near the edges of opening 130.

In FIG. 5, barrier 140 includes first wall portion(s) 144 meeting second wall portion(s) 146 at corner(s) 148, e.g., in a rectangular shape. However, rather than chamfer wall portions 150, barrier 140 includes a corner buttress 156 at one or more corners 148. In certain embodiments, as shown, barrier 140 may include a corner buttresses 156 positioned at each corner 148. A corner buttress 156 may include a first buttress wall portion 160 coupling an extension 162 of first wall portion 144 and second wall portion 146. Corner buttress 156 also includes a second buttress wall portion 164 coupling an extension 166 of second wall portion 146 and first wall portion 144. Corner buttress 156 also includes a third buttress wall portion 168 coupling extension 162 of first wall portion 144 and extension 166 of second wall portion 146. Each corner buttress 156 includes plurality of interconnected wire and via layers 142, i.e., vertically into the page. Collectively, corner buttress 156 forms three triangular wall sections 170A-C external to corners 148. Corner buttress(es) 156 improve the barrier's stress damage resistance and hermetic sealing by providing a wall portion in locations where stress is highest, but also outside of the interior of corner 148 so as to not interfere with space for optical element 138. FIG. 5 shows barrier 140 with optical element 138 therein.

As shown in FIG. 6, in certain embodiments, barrier 140 includes the additional structures of both FIGS. 4 and 5. More particularly, barrier 140 includes first wall portion(s) 144 meeting second wall portion(s) 146 at corner(s) 148, and chamfer wall portion(s) 150 spanning between first wall portion(s) 144 and second wall portion(s) 146 across corner(s) 148. In the example shown, first wall portion(s) 144 meets second wall portion(s) 146 at perpendicular angles at corner(s) 148. Hence, chamfer wall portion(s) 150 span between first wall portion(s) 146 and second wall portion(s) 146 across the perpendicular angle. As noted, wall portions 144, 146 may not meet at perpendicular angles. In the FIG. 6 embodiment, barrier 140 may also include corner buttress(es) 156 at one or more corners 148. As noted, corner buttress 156 includes first buttress wall portion 160 coupling extension 162 of first wall portion 144 and second wall portion 146. Corner buttress 156 also includes second buttress wall portion 164 coupling extension 166 of second wall portion 146 and first wall portion 144. Corner buttress 156 also includes third buttress wall portion 168 coupling extension 162 of first wall portion 144 and extension 166 of second wall portion 146. First and second wall portions 144, 146, extensions 162, 166 thereof, chamfer wall portions 150, and wall portions 160, 164, 168 of corner buttress 156 includes plurality of interconnected wire and via layers 142. Use of chamfer wall portion 150 and corner buttress(es) 156 collectively improves the barrier's stress damage resistance and hermetic seal maintenance by providing barrier wall portions in locations where stress and strain is highest, and both inside and outside of the interior of corners 148. FIG. 6 shows barrier 140 with optical element 138 therein.

Figure 7:
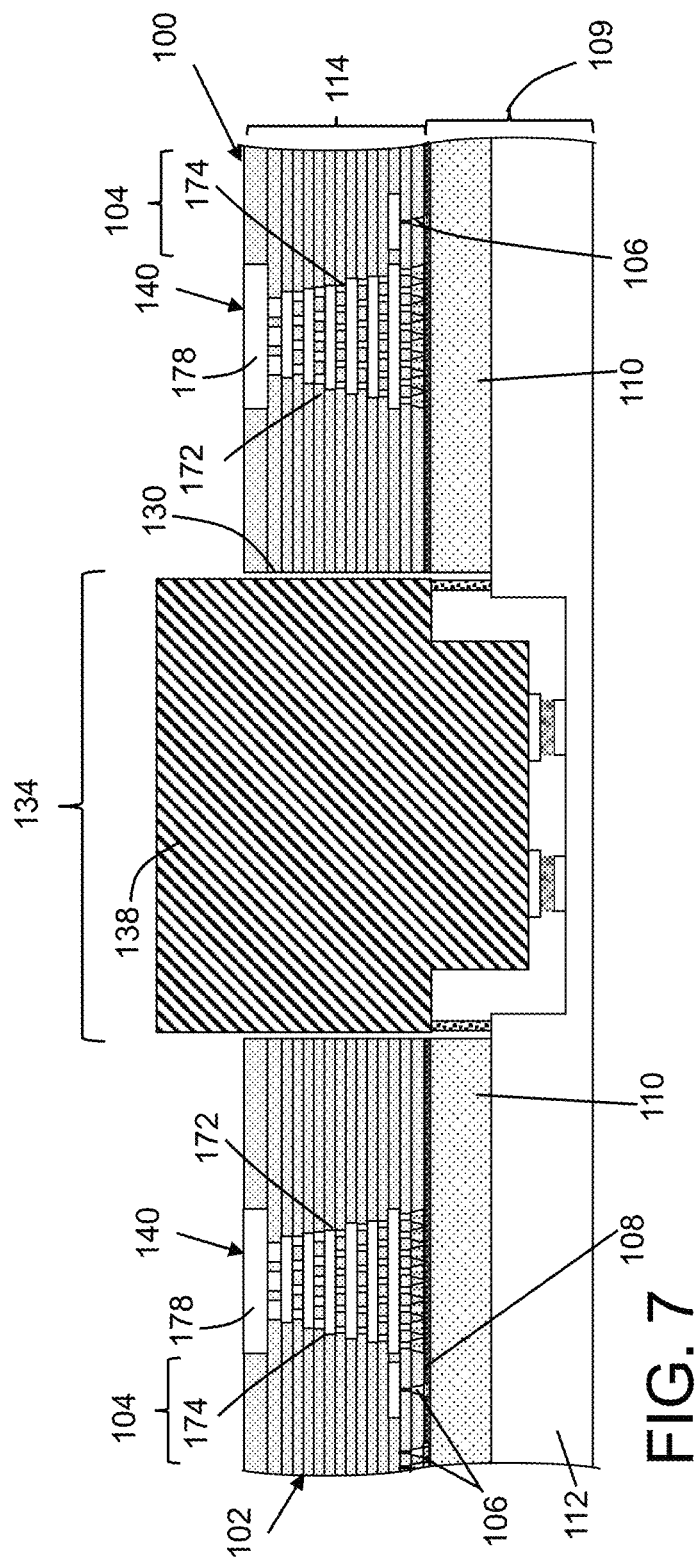
FIG. 7 shows an enlarged, partial cross-sectional view of a barrier and optical element in a PIC structure, according to embodiments of the disclosure.
Figure 8:
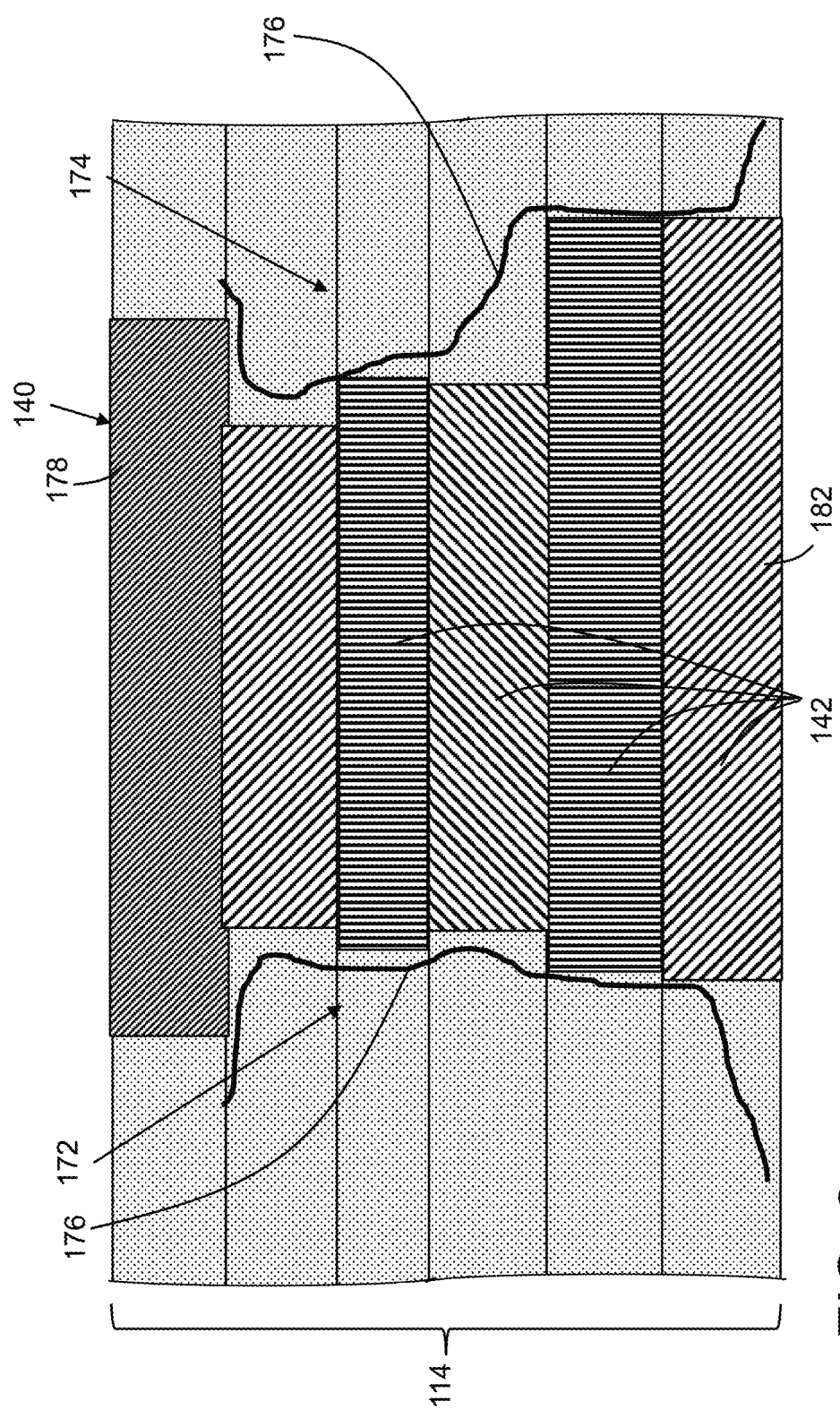
FIG. 8 shows an enlarged cross-sectional view of a barrier for a PIC structure, according to embodiments of the disclosure.

In terms of vertical cross-sectional shape, barrier 140 can have a variety of shapes. As shown in FIG. 3, barrier 140 may have a periphery that has generally vertically aligned inner and outer sidewalls 172, 174, respectively. As shown in FIG. 7, barrier 140 may have a periphery that has generally stepped inner and outer sidewalls 172, 174, respectively. Sidewalls 172, 174 in FIG. 7 may be referred to as stepped bidirectional bumpers. Here, barrier 140 narrows as it extends upwardly. An outermost layer 178 of barrier 140 may be wider than layers below it to trap cracks/delaminations. Barrier 140 may be generally symmetrical (see e.g., FIG. 7), but perfect symmetry is not necessary (see e.g., FIG. 8). As shown in FIG. 8, stepped sidewalls 172, 174 may be beneficial because of their ability to redirect any crack 176 propagation in a direction where it can do less harm, such as vertically toward outermost layer 178 of barrier 140. Where stepped bidirectional bumpers are used, they can redirect cracks or delaminations regardless of whether they originate from opening 130 and are propagating outwardly, or originate elsewhere on body 102 and are propagating inwardly toward opening 130.

Barrier 140, regardless of embodiment, may be formed with plurality of dielectric interconnect layers 114 over active layer 108 of active region 104 of PIC structure 100 in a manner similar to crack stop rings 120 (FIGS. 1 and 2). As noted, after fabrication, barrier 140 surrounds reserved area 134 within active region 104, and opening 130 is formed therein. As noted, barrier 140 may be formed with first wall portion(s) 140 meeting second wall portion(s) 142 at corner(s) 148, and with chamfer wall portion(s) 150 spanning between respective first wall portion(s) 140 and second wall portion(s) 142 across a respective corner(s) 148. Where provided, barrier 140 may also include forming a corner buttress(es) 156 including forming: extensions 162, 166 of first and second wall portions 144, 146, and wall portions 160, 164, 168 of corner buttress 156. Barrier 140 may include a plurality of interconnected (metal) wire and via layers 142. The metal wire and via layers of crack stop ring 120 may include the same materials as the electrical interconnects (not shown) in dielectric interconnect layers 114, and may be formed using any thin film technology.

Figure 9:
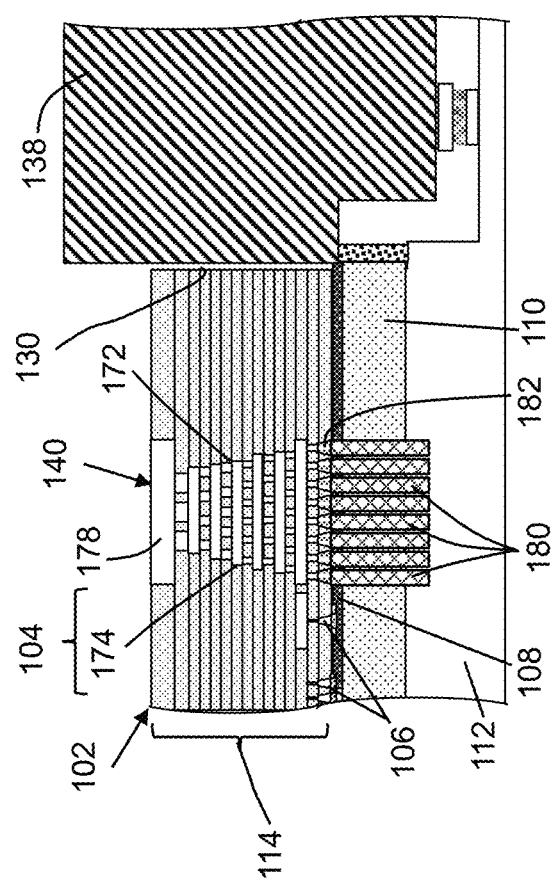
FIG. 9 shows an enlarged cross-sectional view of a barrier for a PIC structure, according to embodiments of the disclosure.

Referring to FIG. 9, barrier 140 may optionally include a plurality of anchors 180 coupled to a lowermost layer 182 of plurality of interconnected wires and via layers 142. Anchors 180 extend at least into base substrate 112 to improve physical coupling of barrier 140 and increase resistance to stress damage propagating from or to opening 130. Anchors 180 may be formed during formation of, and in a manner similar to, through silicon vias (TSVs). As the techniques to form TSVs is known, no further details are necessary.

Figure 10:
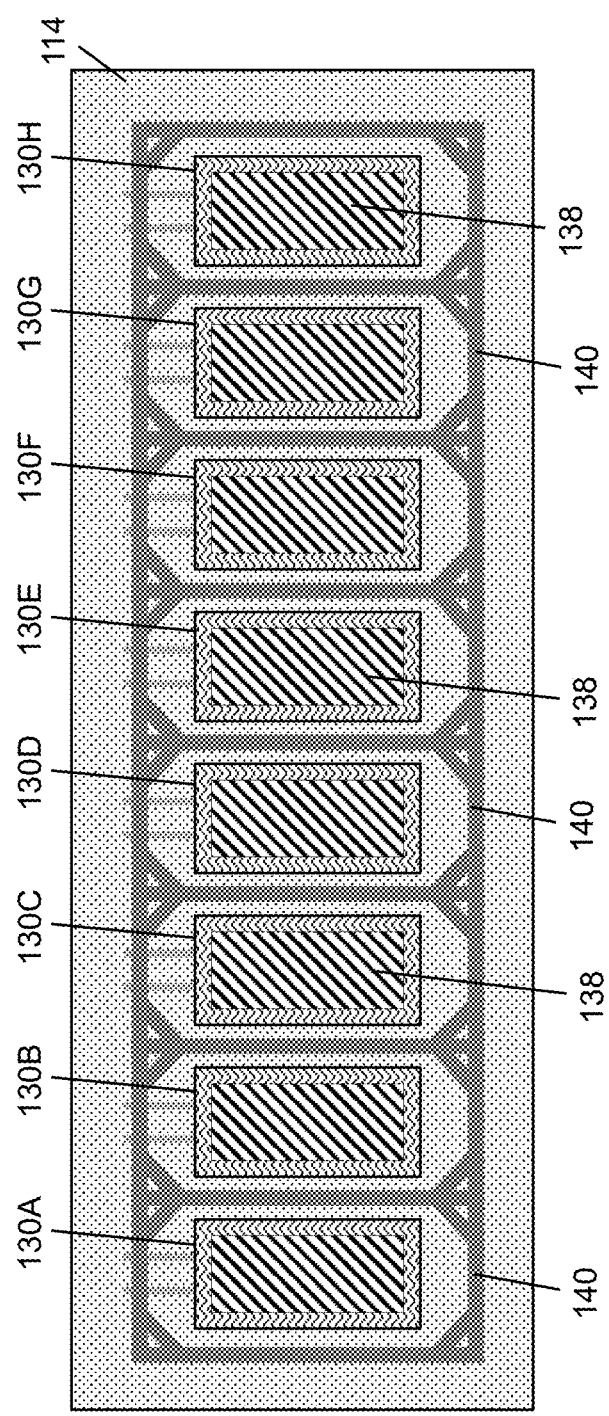
FIG. 10 shows a plan view of a barrier for a plurality of optical elements in a PIC structure, according to embodiments of the disclosure.

Referring to FIG. 10, in certain embodiments, opening 130 may include a plurality of openings 130A-H defined within plurality of dielectric interconnect layers 114 and positioned within active region 104. In FIG. 10, eight (8) openings 130A-H are shown, but it should be recognized that any number can be employed. As in FIG. 3, each opening 130A-H extends to at least active layer 108, and may extend into base substrate 112. Barrier 140 within the plurality of dielectric interconnect layers 114 surrounds each opening 130A-H. An optical element 138 may be positioned within each opening 130A-H. Openings 130A-H may be formed as described herein, and may be defined within plurality of dielectric interconnect layers 114 and positioned within active region 104. Each opening 130A-H extends to at least the active layer 108, and perhaps into buried insulator layer 110 and substrate 112. Here, barrier 140 within dielectric interconnect layers 122 surrounds each opening 130A-H. Hence, barrier 140 provides a wall portion between each element 138 (like a cage around the elements), which prevents interaction between multiple neighboring openings 130A-H. While any embodiment of barrier 140 described herein can be used, the stepped bidirectional bumper embodiment of FIG. 7 is advantageous for the FIG. 10 embodiment because of its increased ability to handle stresses propagating from any direction. An optical element 138 may be coupled within each opening 130A-H. Here, barrier 140 can resist stress damage from propagating to or from openings 130A-H and forming cracks, delaminations and other physical damage. Barrier 140 also maintains a hermetic seal and provides additional structural support to dielectric interconnect layers 114.

Figure 11:
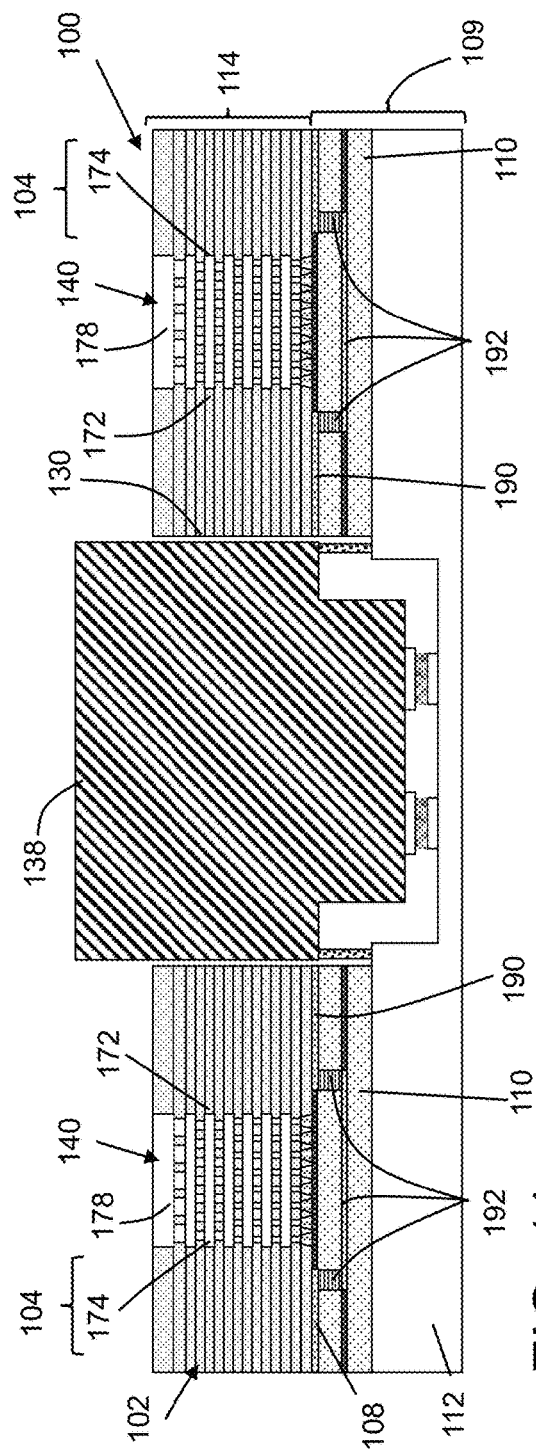
FIG. 11 shows a cross-sectional view of a barrier and optical element in a PIC structure, according to other embodiments of the disclosure.
Figure 12:
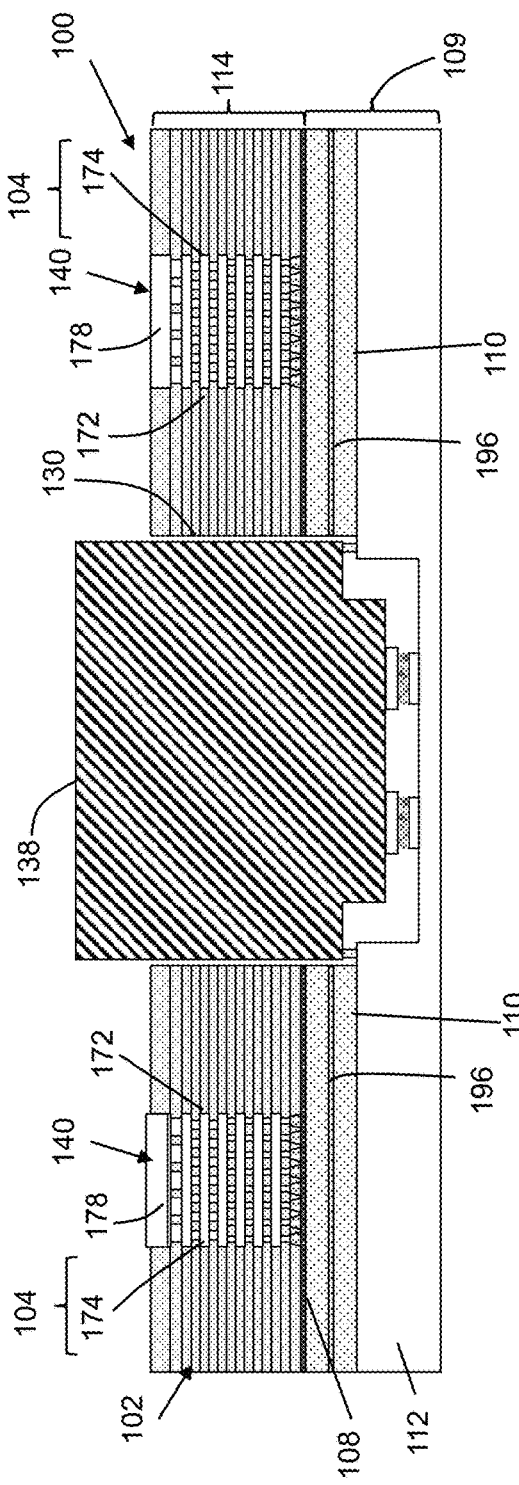
FIG. 12 shows a cross-sectional view of a barrier and optical element in a PIC structure, according to other embodiments of the disclosure.
Figure 13:
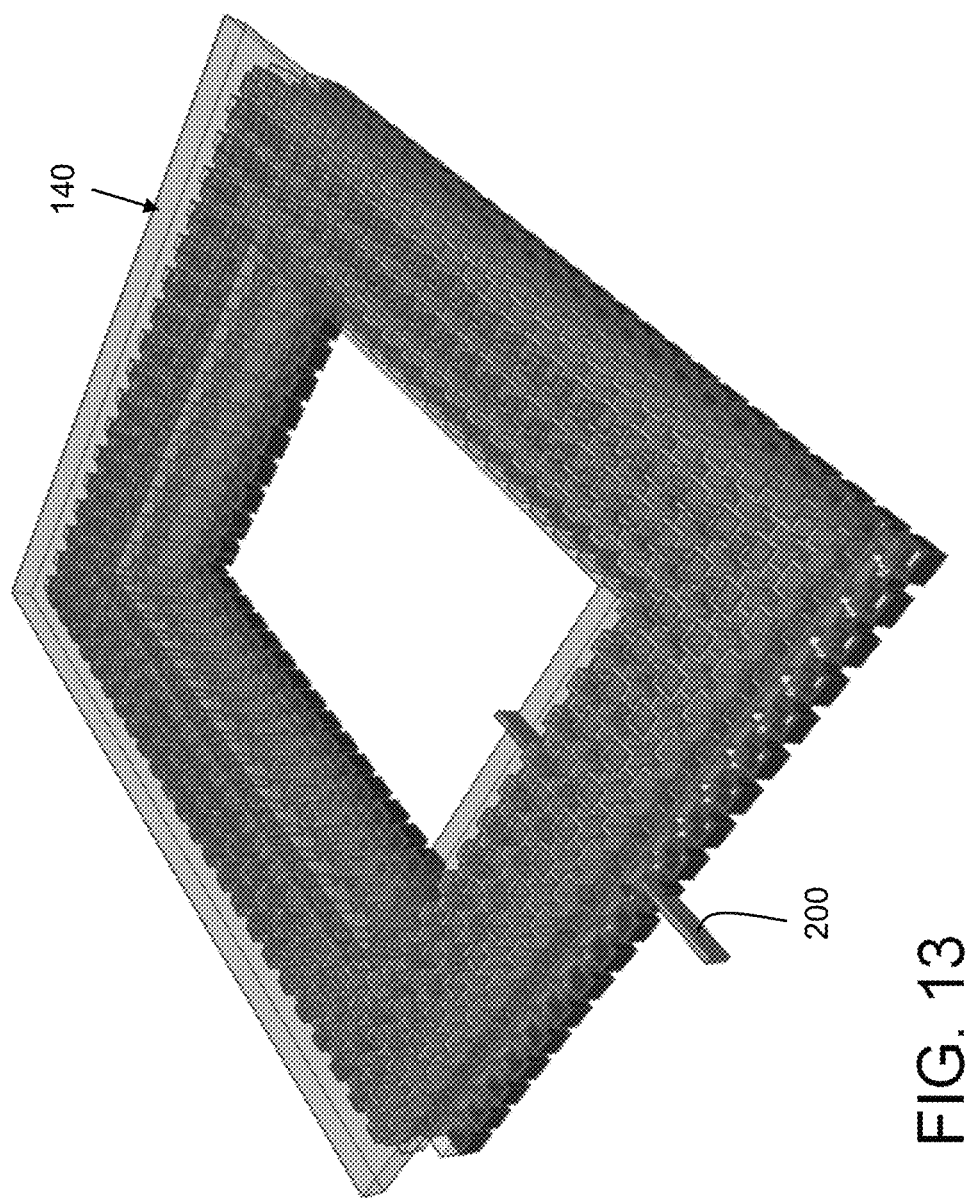
FIG. 13 shows a perspective view of a barrier with a waveguide therethrough for a PIC structure, according to other embodiments of the disclosure.

Optical element 138 may optically communicate with one or more components in at least one of dielectric interconnect layers 114, buried insulator layer 110, active layer 108 and base substrate 112. The optical communication can be configured in a number of ways. In certain embodiments, as shown in FIG. 2, optical element 138 may optically communicate directly with a photodetector 184 facing into opening 130 from dielectric interconnect layers 114 adjacent opening 130. Photodetector 184 may then electrically communicate under barrier 140 through electrical interconnects 186 (e.g., doped wells) in dielectric interconnect layer(s) 114, active layer 108, buried insulator layer 110 and/or base substrate 112. In other embodiments, as shown in FIG. 11, optical element 138 may optically communicate directly with a waveguide 190 facing into opening 130 from dielectric interconnect layers 114 adjacent opening 130. Waveguide 190 may then optically communicate under barrier 140 through optical interconnects 192 (optical tunnel) in dielectric interconnect layers 114, active layer 108, buried insulator layer 110 and/or base substrate 112. In certain embodiments, as shown in FIG. 12, optical element 138 may optically communicate directly with a waveguide 196 facing into opening 130 from buried insulator layer 110 adjacent opening 130. Waveguide 196 may then optically communicate under barrier 140 in buried insulator layer 110. In another embodiment, shown in FIG. 13, a waveguide 200 may extend laterally through barrier 140. Waveguide 200 may be configured to optically communicate between optical element 138 and a component, e.g., photodetector, waveguide, etc., in plurality of dielectric interconnect layers 114 and perhaps in at least one of buried insulator layer 110, active layer 108 and base substrate 112. Waveguides described herein may include any now known or later developed waveguide structure and materials, e.g., silicon and/or silicon nitride.

Figure 14:
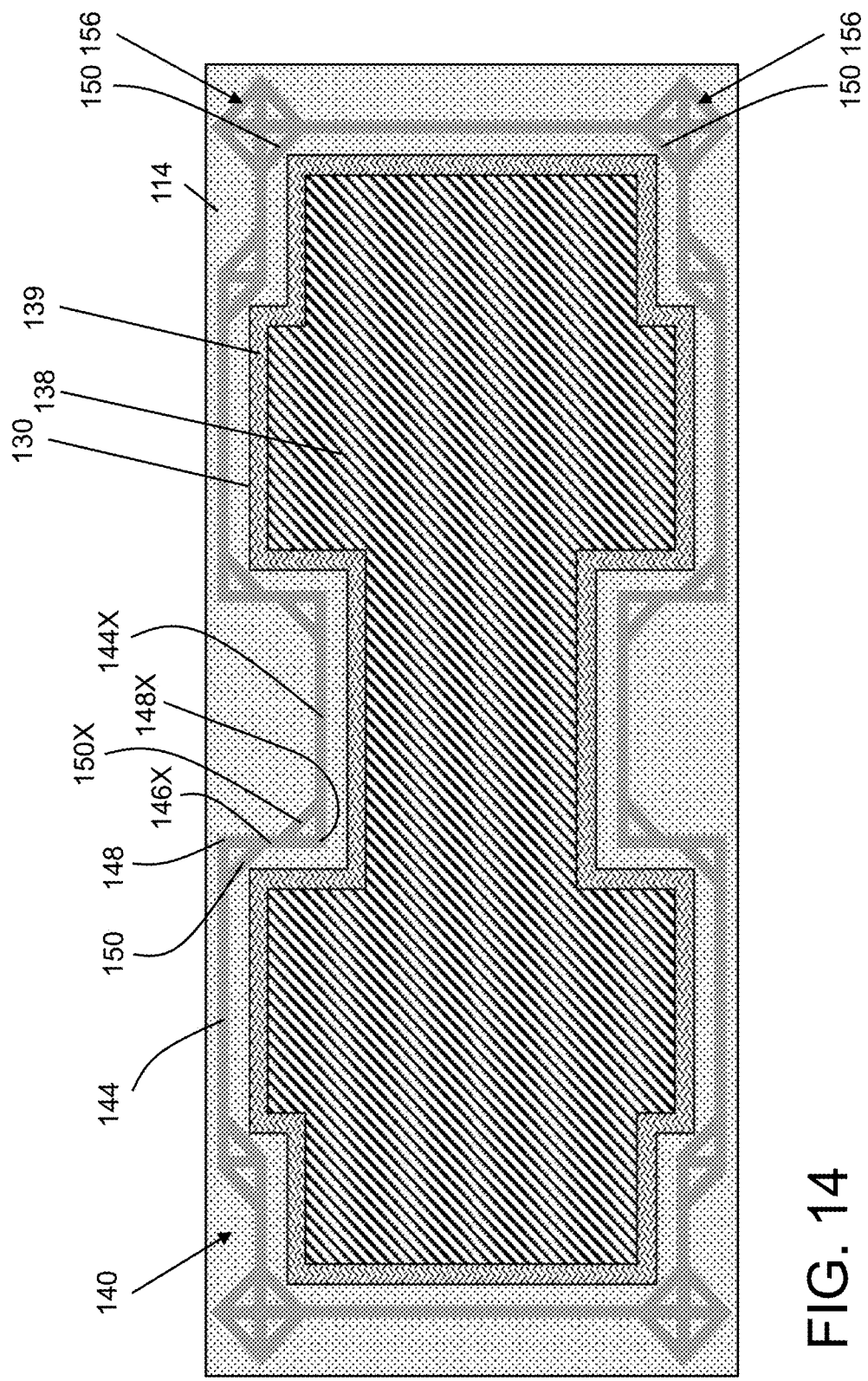
FIG. 14 shows a schematic plan view of a barrier in a PIC structure, according to other embodiments of the disclosure.

In the previously described embodiments, opening 130, optical element 138 and barrier 140 are illustrated mostly as rectangular. As shown in FIG. 14, opening 130, optical element 138 and/or barrier 140 may have other shapes. In the example shown, they are hammer-head shaped. Barrier 140 may include any of chamfer wall portions 150 and corner buttresses 156, as desired. FIG. 14 also illustrates that a chamfer wall portion 150X may also face outwardly from opening 130 where a first wall portion 144X and second wall portion 146X meet in a manner that faces outwardly of opening 130, creating an outwardly facing corner 148X.

Figure 15:
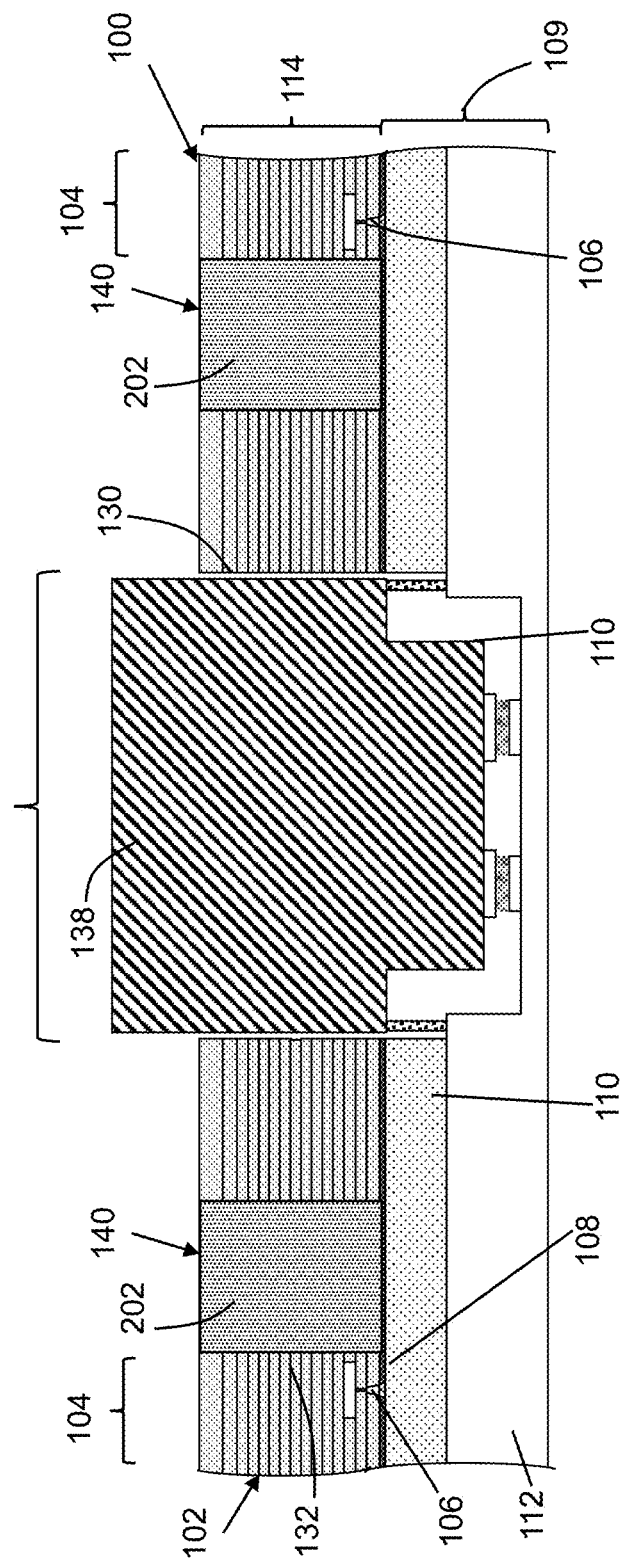
FIG. 15 shows a cross-sectional view of a barrier and optical element in a PIC structure, according to additional embodiments of the disclosure.

FIG. 15 shows a cross-sectional view of another embodiment of barrier 140 in PIC structure 100. Here, barrier 140 includes a solid material 202, forming a solid wall portion about opening 130. Material 202 can include, for example, a dielectric such as an oxide, or a conductor such as those used for TSVs, e.g., copper, tungsten, aluminum.

Any of the embodiments of barrier 140 can be used with any other embodiment.

Embodiments of the disclosure provide a PIC structure including a barrier to prevent stress damage, such as cracks and/or delaminations, from propagating from or to an opening within an active region for an optical element. In one example, for the FIG. 5 embodiment, data shows up to 32% reduction in stress and strain at a corner compared to an opening without the barrier. The barrier also maintains the hermetic seal of the BEOL dielectric interconnect layers despite the opening being formed therein. Barrier 140 also reinforces the dielectric interconnect layers. Where more than one optical element is provided, the barrier provides a wall portion between each element, i.e., like a cage around the elements.

The method and structure as described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A photonic integrated circuit (PIC) structure, comprising:
   an active region in at least an active layer over a substrate;
   a plurality of dielectric interconnect layers over the active region;
   an opening defined through the plurality of dielectric interconnect layers and positioned within the active region, the opening extending to at least the active layer; and
   a barrier within the plurality of dielectric interconnect layers and surrounding the opening, the barrier including
      a first wall portion meeting a second wall portion at a corner, and
      a first buttress wall portion coupling an extension of the first wall portion and the second wall portion.

2. The PIC structure of claim 1, further comprising a chamfer wall portion spanning between the first wall portion and the second wall portion across the corner.

3. The PIC structure of claim 2, wherein the barrier further includes:
   a second buttress wall portion coupling an extension of the second wall portion and the first wall portion; and
   a third buttress wall portion coupling the extension of the first wall portion and the extension of the second wall portion.

4. The PIC structure of claim 1, wherein the barrier is rectangular and the first wall portion includes a pair of first wall portions and the second wall portion includes an opposing pair of second wall portions, the pair of first wall portions meeting the opposing pair of second wall portions to form four corners, and wherein a chamfer wall portion spans between each first wall portion and a respective second wall portion across each corner.

5. The PIC structure of claim 1, wherein the barrier further includes a corner buttress including:
   the first buttress wall portion coupled to the extension of the first wall portion and the second wall portion;
   a second buttress wall portion coupling an extension of the second wall portion and the first wall portion; and
   a third buttress wall portion coupling the extension of the first wall portion and the extension of the second wall portion.

6. The PIC structure of claim 5, wherein the barrier is rectangular and the first wall portion includes a pair of first wall portions and the second wall portion includes an opposing pair of second wall portions, the pair of first wall portions meeting the opposing pair of second wall portions to form four corners, and wherein a corner buttress is positioned at each corner.

7. The PIC structure of claim 1, wherein the opening includes a plurality of openings defined within the plurality of dielectric interconnect layers and positioned within the active region, each opening extending to at least the active layer, and wherein the barrier within the plurality of dielectric interconnect layers surrounds each opening, and
   further comprising an optical element positioned within each opening.

8. The PIC structure of claim 1, wherein the barrier includes a plurality of interconnected wire and via layers; and
   a plurality of anchors coupled to a lowermost one of the plurality of interconnected wires and via layers, and extending at least into the substrate.

9. The PIC structure of claim 1, further comprising:
   an optical element positioned in the opening; and
   a waveguide extending laterally through the barrier, the waveguide configured to optically communicate between the optical element and a component in at least one of the plurality of interconnect layers, the active layer and the substrate.

10. The PIC structure of claim 1, further comprising a crack stop ring extending about an outer periphery of the PIC structure, and the crack stop ring positioned outside of the active region.

11. A photonic integrated circuit (PIC) structure, comprising:
    an active region in at least an active layer over a substrate;
    a plurality of dielectric interconnect layers over the active region;
    an opening defined through the plurality of interconnect layers and positioned within the active region, the opening extending to at least the active layer; and
    a barrier within the plurality of dielectric interconnect layers and surrounding the opening;
    wherein the barrier includes:
       a first wall portion meeting a second wall portion at a corner,
       a first buttress wall portion coupling an extension of the first wall portion and the second wall portion, and
       a chamfer wall portion spanning between the first wall portion and the second wall portion across the corner.

12. The PIC structure of claim 11, wherein the barrier further includes a corner buttress:
    the first buttress wall portion coupled to the extension of the first wall portion and the second wall portion;
    a second buttress wall portion coupling an extension of the second wall portion and the first wall portion; and
    a third buttress wall portion coupling the extension of the first wall portion and the extension of the second wall portion.

13. The PIC structure of claim 11, wherein the barrier includes a plurality of interconnected wire and via layers; and
    a plurality of anchors coupled to a lowermost one of the plurality of interconnected wires and via layers, and extending at least into the substrate.

14. The PIC structure of claim 11, further comprising a crack stop ring extending about an outer periphery of the PIC structure, the crack stop ring positioned outside of the active region.

15. The PIC structure of claim 11, further comprising:
    an optical element positioned in the opening; and
    a waveguide extending laterally through the barrier, the waveguide configured to optically communicate between the optical element and a component in at least one of the plurality of interconnect layers, the active layer and the substrate.

16. A method, comprising:
  forming a barrier with a plurality of dielectric interconnect layers over an active layer of an active region of a photonics integrated circuit (PIC) structure, the barrier surrounding a reserved area within the active region;
  forming an opening in the reserved area and through the plurality of dielectric interconnect layers to at least the active layer of the active region; and
  wherein the barrier includes:
    a first wall portion meeting a second wall portion at a corner,
    a first buttress wall portion coupling an extension of the first wall portion and the second wall portion, and
    a chamfer wall portion spanning between the first wall portion and the second wall portion across the corner.

17. The method of claim 16, wherein forming the barrier further includes forming a corner buttress including:
  forming the first buttress wall portion coupling the extension of the first wall portion and the second wall portion;
  forming a second buttress wall portion coupling an extension of the second wall portion and the first wall portion; and
  forming a third buttress wall portion coupling the extension of the first wall portion and the extension of the second wall portion.

18. The method of claim 16, wherein forming the opening includes forming a plurality of openings defined within the plurality of dielectric interconnect layers and positioned within the active region, each opening extending to at least the active layer, and wherein the barrier within the plurality of dielectric interconnect layers surrounds each opening, and
  further comprising coupling an optical element within each opening.

19. The method of claim 16, further comprising coupling an optical element in the opening.

20. The method of claim 16, further comprising, during forming the barrier, forming a crack stop ring extending along an outer periphery of the PIC structure, and positioned outside of an outer extent of the active region.

* * * * *